(12) United States Patent
Hayasaka et al.

(10) Patent No.: US 8,451,352 B2
(45) Date of Patent: May 28, 2013

(54) IMAGE PICKUP APPARATUS

(75) Inventors: Kengo Hayasaka, Tokyo (JP); Kenji Yamamoto, Kanagawa (JP); Isao Ichimura, Tokyo (JP); Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 737 days.

(21) Appl. No.: 12/588,795

(22) Filed: Oct. 28, 2009

(65) Prior Publication Data

US 2010/0128152 A1    May 27, 2010

(30) Foreign Application Priority Data

Nov. 21, 2008 (JP) ................................. 2008-298339
May 8, 2009 (JP) ................................. 2009-113942

(51) Int. Cl.
*H04N 9/07* (2006.01)
*H04N 3/14* (2006.01)
*H04N 5/335* (2011.01)
*H04N 9/04* (2006.01)
*H04N 5/225* (2006.01)

(52) U.S. Cl.
USPC ............ 348/267; 348/276; 348/277; 348/340

(58) Field of Classification Search
USPC ......................................... 348/267, 276, 277
See application file for complete search history.

(56) References Cited

U.S. PATENT DOCUMENTS 3,971,065 A * 7/1976 Bayer ............................ 348/276
5,076,687 A * 12/1991 Adelson ...................... 250/201.7
5,805,217 A * 9/1998 Lu et al. ......................... 348/273
6,396,873 B1 * 5/2002 Goldstein et al. ...... 348/E13.009
7,522,341 B2 * 4/2009 Mouli ............................ 359/619
7,732,744 B2 * 6/2010 Utagawa ........................ 348/340
2005/0057664 A1 * 3/2005 Palum et al. ................. 348/222.1
2005/0073603 A1 * 4/2005 Feldman et al. ............... 348/340
2007/0252074 A1 * 11/2007 Ng et al. ..................... 250/208.1
2008/0012969 A1 * 1/2008 Kasai et al. .................... 348/266
2008/0079748 A1   4/2008 Phan (Continued)

FOREIGN PATENT DOCUMENTS

EP            1 912 434 A1    4/2008
WO          WO-99/26419 A1    5/1999
WO          WO-2006/039486   4/2006

OTHER PUBLICATIONS

R. Ng et al., "Light Field Photography with a Hand-Held Plenoptic Camera," Stanford Tech Report CTSR Feb. 2005.

(Continued)

*Primary Examiner* — Sinh Tran
*Assistant Examiner* — Jason Flohre
(74) *Attorney, Agent, or Firm* — Rader, Fishman & Grauer PLLC

(57) ABSTRACT

An image pickup apparatus allowed to obtain parallax information while preventing a decline in apparent resolution. An image pickup apparatus includes: an image pickup lens having an aperture stop; an image pickup device including a plurality of pixels and obtaining image pickup data based on light received on the plurality of pixels; and a microlens array arranged between the image pickup lens and the image pickup device so that one microlens is allocated to 2×2 pixels in the image pickup device. The plurality of pixels are disposed in a fashion of two-dimensional arrangement along two directions rotated a certain angle with respect to a horizontal direction and a vertical direction, respectively.

8 Claims, 15 Drawing Sheets

U.S. PATENT DOCUMENTS

| | | | |
|---|---|---|---|
| 2008/0128598 A1* | 6/2008 | Kanai et al. | 250/226 |
| 2008/0259201 A1 | 10/2008 | Iijima | |
| 2008/0266655 A1* | 10/2008 | Levoy et al. | 359/368 |
| 2009/0040362 A1* | 2/2009 | Glenn | 348/342 |
| 2009/0185801 A1* | 7/2009 | Georgiev et al. | 348/335 |

OTHER PUBLICATIONS

European Search Report issued Feb. 9, 2010 for corresponding European Application No. 09 25 2560.

* cited by examiner

130R

130G

130B

130W

IMAGE PICKUP APPARATUS

BACKGROUND OF THE INVENTION

1. Field of the Invention

The present invention relates to an image pickup apparatus using a microlens.

2. Description of the Related Art

Various image pickup apparatuses have been proposed and developed. An image pickup apparatus performing predetermined image processing on image pickup data obtained by picking up an image to output the processed image pickup data has been also proposed.

For example, International Patent Publication No. 06/039486 and Ren.Ng, et al. "Light Field Photography with a Hand-Held Plenoptic Camera", Stanford Tech Report CTSR 2005-02 each propose an image pickup apparatus using a technique called "Light Field Photography". The image pickup apparatus has a configuration in which a microlens array is arranged on a plane where an image of an object is formed by an image pickup lens, and an image pickup device is arranged on a focal position of the microlens array. Thereby, in the image pickup device, a light ray from the object is obtained as a light ray vector including not only an intensity distribution but also a traveling direction. Therefore, image pickup data obtained from the image pickup device includes information on parallax, and when predetermined image processing is performed on the image pickup data, the image pickup data is applicable to, for example, three-dimensional display or extraction of distance information.

SUMMARY OF THE INVENTION

In the case where, for example, a parallax image for three-dimensional display is produced based on image pickup data obtained by the above-described technique, the number of pixels in the parallax image (two-dimensional resolution) is equal to the number of lenses in a microlens array. In other words, the number of pixels in the parallax image is equal to a value determined by dividing the total number of pixels in an image pickup device by the number of pixels allocated to each microlens. Therefore, in an image pickup apparatus using the microlens array to produce the above-described parallax image, the resolution of a parallax image finally obtained is easily reduced due to a limit on the number of microlenses.

It is desirable to provide an image pickup apparatus allowed to obtain parallax information while preventing a decline in apparent resolution.

According to an embodiment of the invention, there is provided a first image pickup apparatus including: an image pickup lens having an aperture stop; an image pickup device including a plurality of pixels and obtaining image pickup data based on light received on the plurality of pixels, the plurality of pixels being disposed in a fashion of two-dimensional arrangement along two directions rotated a certain angle with respect to a horizontal direction and a vertical direction, respectively; and a microlens array arranged between the image pickup lens and the image pickup device so that one microlens is allocated to 2×2 pixels in the image pickup device.

According to an embodiment of the invention, there is provided a second image pickup apparatus including: an image pickup lens having an aperture stop; an image pickup device including a plurality of pixels and obtaining image pickup data based on light received on the plurality of pixels, the plurality of pixels being disposed in a fashion of two-dimensional arrangement along two directions rotated a certain angle with respect to a horizontal direction and a vertical direction, respectively; and a microlens array arranged between the image pickup lens and the image pickup device so that one microlens is allocated to 2 or more pixels in the image pickup device.

In the first and second image pickup apparatuses according to the embodiment of the invention, the microlens array in which one microlens is allocated to two or more pixels in the image pickup device is arranged between the image pickup lens and the image pickup device. Thereby, a light ray having passed through each microlens and including information on an intensity distribution of the light ray as well as the traveling direction of the light ray is received on the image pickup device. In this case, in the image pickup device, a plurality of pixels are arranged along two directions forming a certain angle with the lateral and longitudinal directions, respectively, thereby pixel pitches in the horizontal and vertical directions are shorter than a length on a side of each pixel. Therefore, based on the horizontal direction and the vertical direction, compared to the case where pixels with the same size are two-dimensionally arranged along the horizontal and vertical directions, by the above-described pixel arrangement, the pixel pitches are smaller.

In the first and second image pickup apparatuses according to the embodiment of the invention, the microlens array is arranged between the image pickup lens and the image pickup device, and two or more pixels are allocated to each microlens. Therefore, light rays from an object are allowed to be received as light ray vectors with different viewpoints. In this case, a plurality of pixels in the image pickup device are arranged along two directions forming a certain angle with the lateral and longitudinal directions, respectively, so compared to the case where pixels with the same size are arranged along the lateral and the longitudinal directions, the pixel pitches are smaller. Typically, the resolution of an image is recognized by human eyes more easily in the horizontal and vertical directions than in a diagonal direction, so when the above-described pixel arrangement is used, an improvement in apparent resolution is allowed. Therefore, parallax information is obtainable while preventing a decline in apparent resolution.

Moreover, when the image processing section is arranged, and same-position pixel data extracted from a group of pixels located at same position in an arrangement of four pixels allocated to one microlens are synthesized, right-left parallax images or top-bottom parallax image are allowed to be produced. Such parallax images are applicable to, for example, stereo system three-dimensional display.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

First Embodiment

Configuration Example of Image Pickup Apparatus

Figure 1:
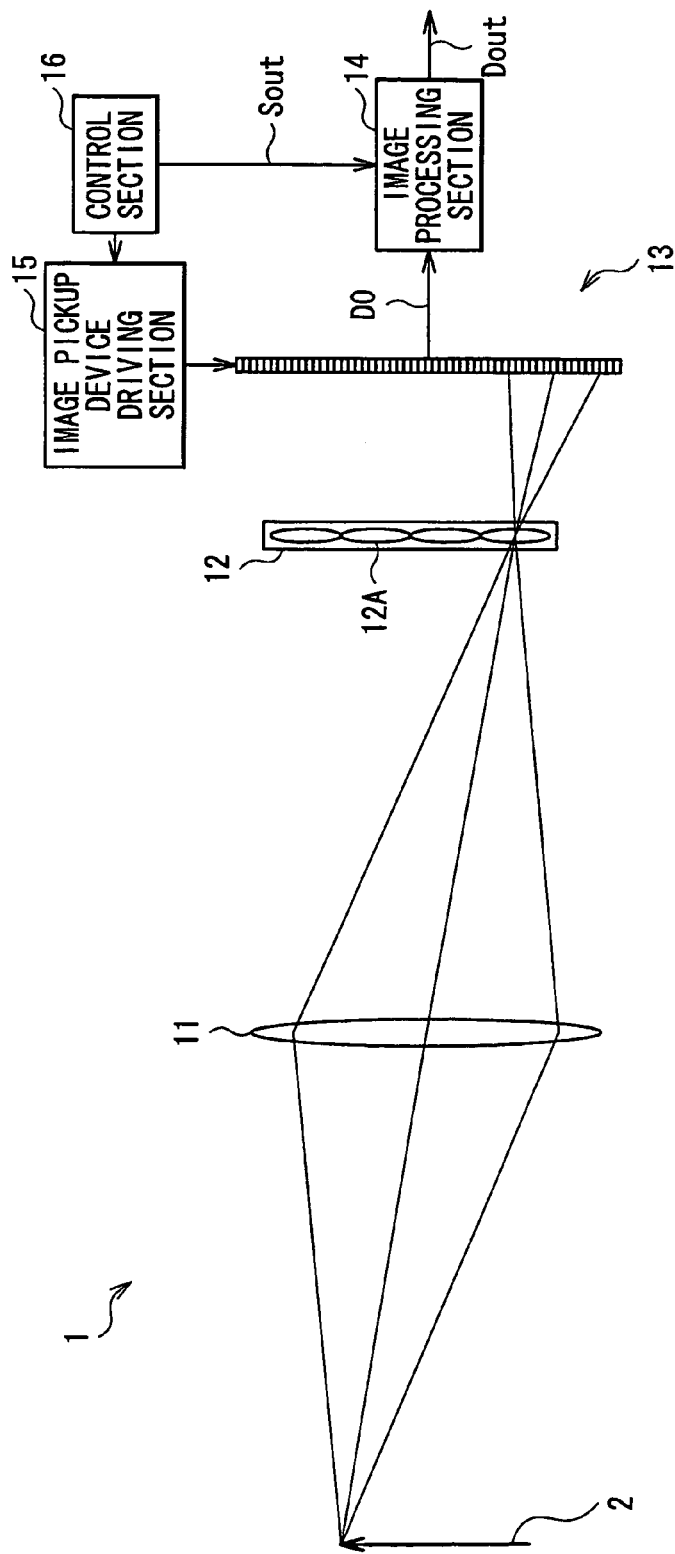
FIG. 1 is an illustration of the whole configuration of an image pickup apparatus according to a first embodiment of the invention.

FIG. 1 illustrates the whole configuration of an image pickup apparatus 1 according to a first embodiment of the invention. The image pickup apparatus 1 picks up an image of an object 2, and performs predetermined image processing on the image, thereby to output image data Dout. The image pickup apparatus 1 includes an image pickup lens 11, a microlens array 12, an image pickup device 13, an image processing section 14, an image pickup device driving section 15 and a control section 16.

The image pickup lens 11 is a main lens for picking up an image of the object 2, and is, for example, a typical image pickup lens used in a video camera, a still camera or the like. An aperture stop is arranged on a light incident side or a light emission side of the image pickup lens 11. An image, which has a shape similar to the shape (for example, a circular shape) of an aperture of the aperture stop, of the object 2 is formed on the image pickup device 13 in each of image formation regions (which will be described later) established by microlenses in the microlens array 12, respectively.

The microlens array 12 includes a plurality of microlenses on a substrate made of, for example, glass or the like. The microlens array 12 is arranged on a focal plane (an image forming plane) of the image pickup lens 11, and the image pickup device 13 is arranged in the focal position of the microlens. Each microlens 12A is made of, for example, a solid lens, a liquid crystal lens, a diffractive lens or the like. As will be described later, the two-dimensional arrangement of microlenses in the microlens array 12 corresponds to a pixel arrangement in the image pickup device 13.

The image pickup device 13 receives a light ray from the microlens array 12 to obtain image pickup data D0. The image pickup device 13 includes a plurality of pixels arranged in a matrix form, and each pixel is made of a two-dimensional solid-state image pickup device such as a CCD (Charge Coupled Device) or a CMOS (Complementary Metal-Oxide Semiconductor).

One microlens in the above-described microlens array 12 is allocated to a number m×n (in this case, 2×2=4) of pixels in the above-described plurality of pixels. In other words, a light ray having passed through each microlens is received by 2×2 pixels of the image pickup device 13. In addition, for example, the angular resolution (the number of viewpoints) of a parallax image which will be described later is increased with an increase in the number m×n of pixels allocated to one microlens. On the other hand, the two-dimensional resolution of the parallax image is increased with a decrease in the number m×n of pixels. Therefore, there is a trade-off relationship between the angular resolution and two-dimensional resolution of the parallax image.

A color filter (not illustrated in FIG. 1) including regularly arranged filter elements of a plurality of colors corresponding to the arrangement of the pixels is arranged on a light-receiving surface of the image pickup device 13. As such a color filter, for example, a color filter in which filter elements of three primary colors, that is, red (R), green (G) and blue (B) are arranged at a predetermined ratio is used. A specific planar configuration of the image pickup device 13 including the arrangement of the filter elements of each color will be described later.

The image processing section 14 includes a parallax image producing section 143 (which will be described in detail later), and performs predetermined image processing on the image pickup data D0 obtained from the image pickup device 13, and outputs, for example, the image data Dout as a parallax image. A specific image processing operation of the image processing section 14 will be described later.

The image pickup device driving section 15 drives the image pickup device 13, and controls the light reception operation of the image pickup device 13.

The control section 16 controls the operations of the image processing section 14 and the image pickup device driving section 15, and includes, for example, a microcomputer or the like.

Example of Pixel Arrangement in Image Pickup Apparatus

Figure 2:
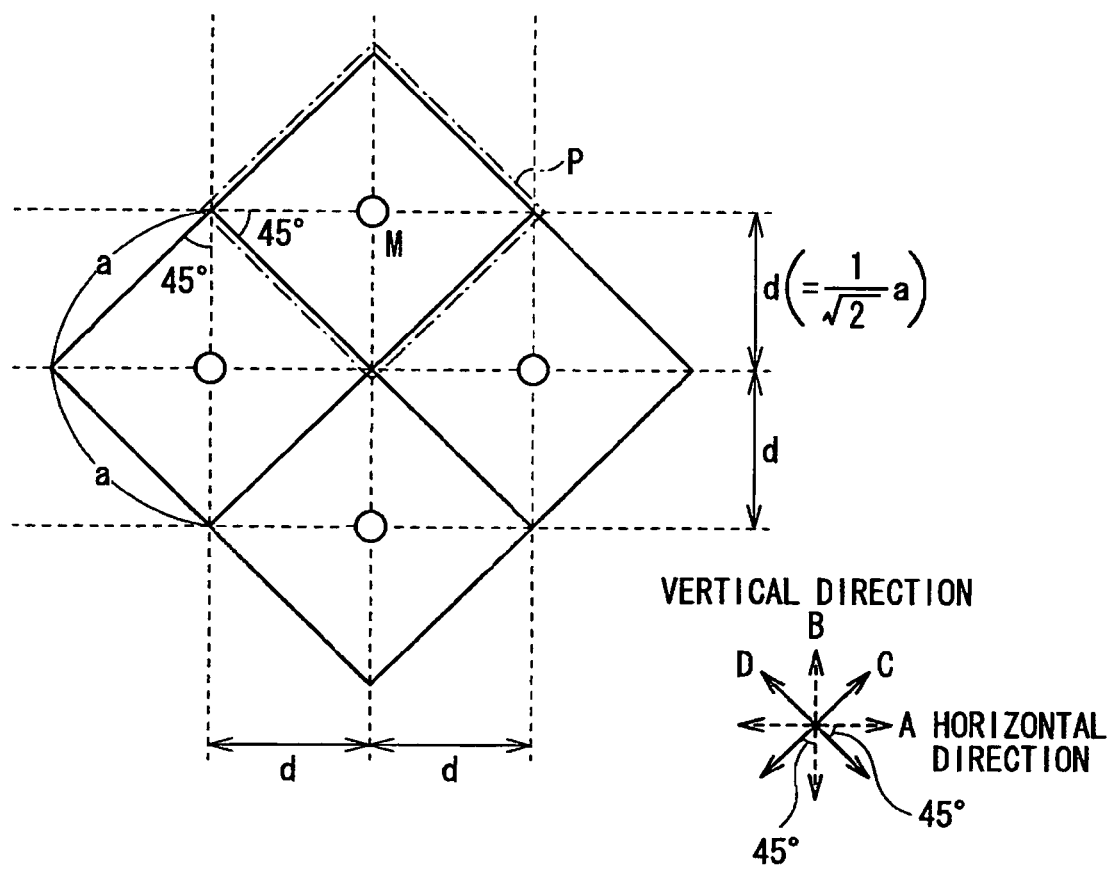
FIG. 2 is a plan view for describing a pixel arrangement in an image pickup device illustrated in FIG. 1.

Now, referring to FIG. 2, the pixel arrangement in the image pickup device 13 will be described below. In FIG. 2, for the sake of convenience, only 2×2 pixels P allocated to one microlens are illustrated. Moreover, a horizontal direction A (a lateral direction) and a vertical direction B (a longitudinal direction) are a horizontal direction and a vertical direction when an image based on the image pickup data Dout is visually recognized.

The image pickup device 13 includes square-shaped pixels P with a length a on a side, which are disposed in a fashion of two dimensional arrangement along two directions diagonal to the horizontal direction A and the vertical direction B, respectively (hereinafter such an arrangement is simply referred to as "diagonal arrangement"), for example, along directions C and D forming 45° with the horizontal direction A and the vertical direction B, respectively. In other words, a plurality of pixels P which are arranged in a grid pattern (squarely arranged) along the horizontal direction A and the vertical direction B are rotated at a predetermined angle, for example, 45° in a light-receiving surface. The above-described microlens array 12 also has a planar configuration in which microlenses are disposed in a fashion of two-dimensional arrangement along two directions rotated 45° with respect to the horizontal direction A and the vertical direction B corresponding to the diagonal arrangement in the image pickup device 13.

As described above, the color filter is arranged on the light-receiving surface of the image pickup device 13, and the color filter has, for example, the following color arrangement.

Figure 3:
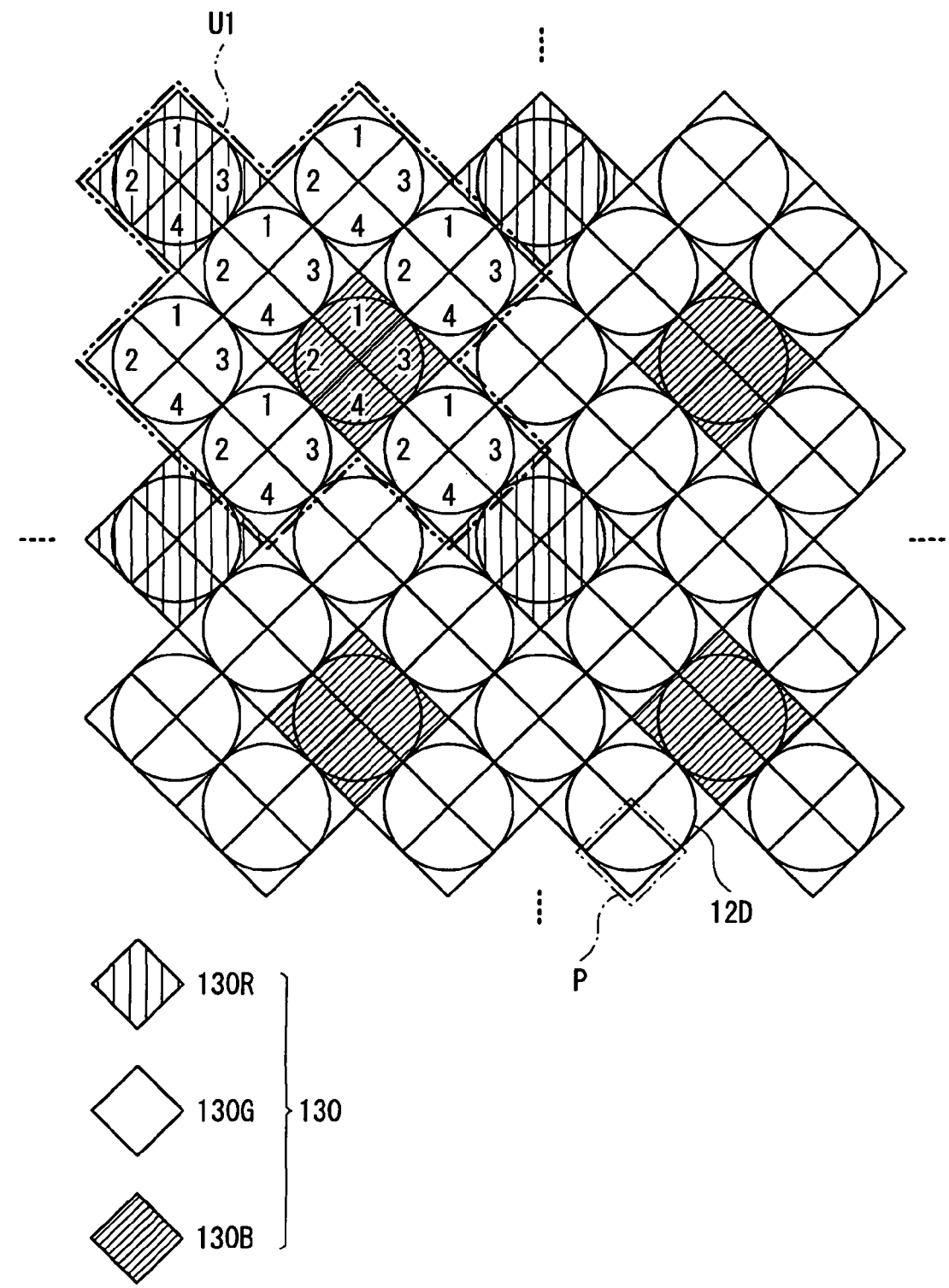
FIG. 3 is a schematic plan view of a color filter on the image pickup device illustrated in FIG. 1.

FIG. 3 schematically illustrates a planar configuration of a color filter 130 on the image pickup device 13. In addition, FIG. 3 schematically illustrates a unit image formation region 12D established by one microlens, corresponding to a region including 2×2 pixels.

The color filter 130 is divided by color into regions each corresponding to an arrangement of 2×2 pixels, and includes filter elements of primary colors, for example, red filter elements 130R, green filter element 130G and blue filter elements 130B. The red filter elements 130R, the green filter elements 130G and the blue filter elements 130B are disposed in a fashion of two-dimensional arrangement along two directions rotated 45° with respect to the horizontal direction A and the vertical direction B, respectively, corresponding to the diagonal arrangement of the pixels P. In the embodiment, the green filter elements 130G is the largest in number among the filter elements of the primary colors, and the red filter elements 130R, the green filter elements 130G and the blue filter elements 130B are arranged, for example, at a ratio (R:G:B) of 1:6:1. More specifically, the color filter 130 has a configuration in which each red filter element 130R and each blue filter element 130B are surrounded by 9 green filter elements 130G, and a region enclosed by a chain double-dashed line in FIG. 3 is a unit arrangement U1.

Next, functions and effects of the above-described image pickup apparatus 1 will be described below referring to drawings.

Image Pickup Operation

First, referring to FIGS. 1 to 4, an image pickup operation in the image pickup apparatus 1 will be described below. In the image pickup apparatus 1, an image of the object 2 by the image pickup lens 11 is formed on the image pickup device 13 through the microlens array 12. At this time, for example, 2×2=4 pixels are allocated to one microlens in the microlens array 12, so in the image pickup device 13, as illustrated in FIG. 3, the unit image formation region 12D as the image of the object 2 is formed in each region including 2×2 pixels.

Figure 4:
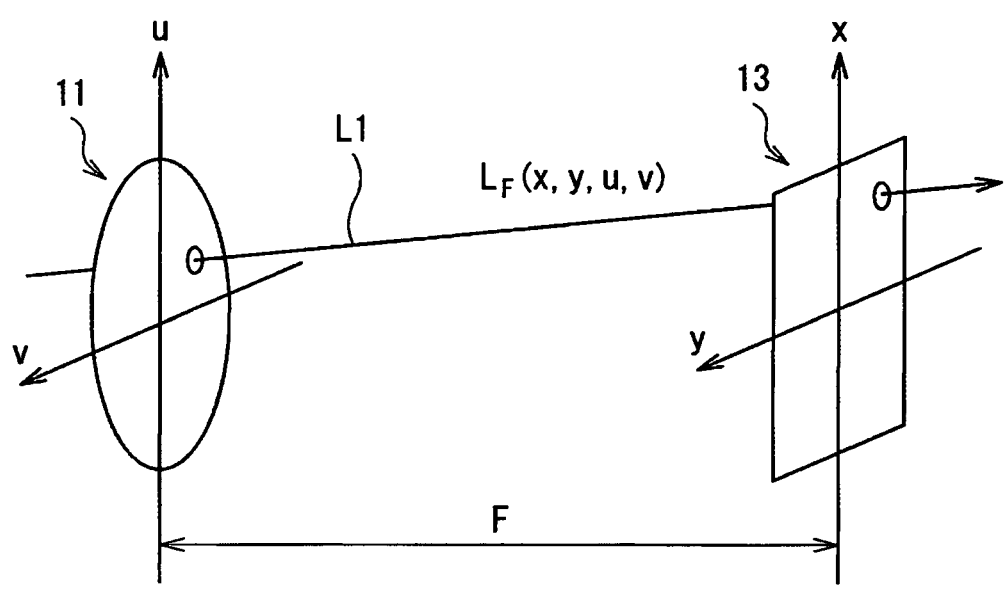
FIG. 4 is an illustration for describing a light ray received on the image pickup device.

When light is received by the image pickup device 13 in such a manner, the image pickup data D0 is obtained according to a drive operation by the image pickup device driving section 15. Now, referring to FIG. 4, information included in the image pickup data D0 which is obtained from the image pickup device 13 will be described below. FIG. 4 schematically illustrates a light ray received by the image pickup device 13. As illustrated in the drawing, a rectangular coordinate system (u, v) is defined on a lens plane of the image pickup lens 11, and a rectangular coordinate system (x, y) is defined on an image pickup plane of the image pickup device 13. A distance between the image pickup lens plane of the image pickup lens 11 and the image pickup plane of the image pickup device 13 is defined as "F". Then, a light ray L1 passing through the image pickup lens 11 and the image pickup device 13 is represented by a four-dimensional function $L_F(x, y, u, v)$. In other words, a light ray from the object 2 is stored in the image pickup device 13 as a light ray vector including information on the traveling direction of the light ray in addition to an intensity distribution of the light ray.

Moreover, in the embodiment, the color filter 130 which is divided into pixel units, that is, the regions each including 2×2=4 pixels allocated to each microlens is arranged on the light-receiving surface of the image pickup device 13. Therefore, the image pickup data D0 is obtained as color image pickup data corresponding to the arrangement of the red filter elements 130R, the green filter elements 130G and the blue filter elements 130B in the color filter 130. The image pickup data D0 obtained in such a manner is outputted to the image processing section 14.

Image Processing Operation

Figure 5:
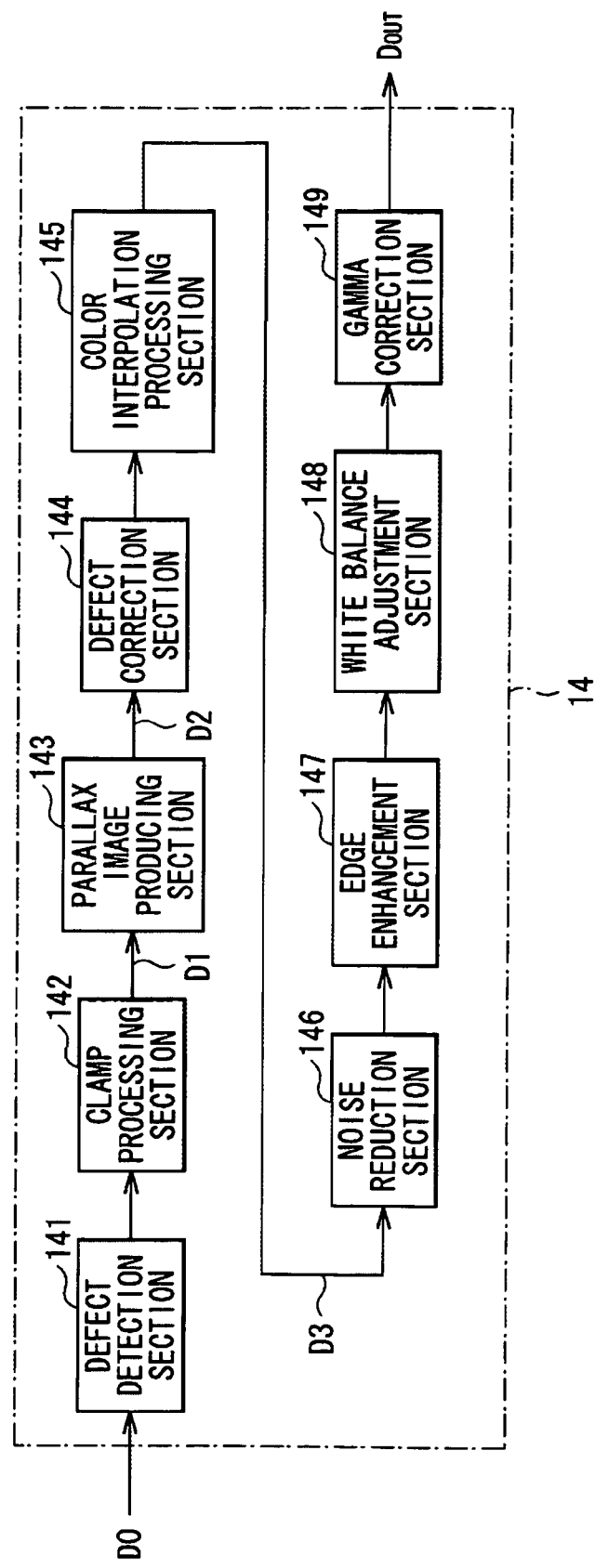
FIG. 5 is a functional block diagram illustrating a configuration of an image processing section illustrated in FIG. 1.

Next, referring to FIGS. 5 and 6, an image processing operation in the image pickup apparatus 1 will be described below. When the above-described image pickup data D0 is inputted into the image processing section 14, the image processing section 14 performs predetermined image processing on the image pickup data D0 to produce the image data Dout, and then outputs the image data Dout as a parallax image. FIG. 5 is a functional block diagram illustrating the whole configuration of the image processing section 14. The image processing section 14 includes, for example, a defect detection section 141, a clamp processing section 142, the parallax image producing section 143, a defect correction section 144, a color interpolation processing section 145, a noise reduction section 146, an edge enhancement section 147, a white balance adjustment section 148 and a gamma correction section 149.

In the image processing section 14, first, the defect detection section 141 detects a defect such as loss or invalidity included in the image pickup data D0 (a defect caused by an abnormality in the image pickup device 13). Next, the clamp processing section 142 performs a process (clamp processing) of setting a black level on the image pickup data from which a defect is detected by the defect detection section 141. Thereby, image pickup data D1 is obtained, and is outputted to the parallax image producing section 143.

The parallax image producing section 143 produces a plurality of parallax images from different viewpoints based on the image pickup data D1. As described above, the image pickup data D1 includes information on the traveling direction of the light ray in addition to the intensity distribution of the light ray in each unit image formation region 12D, so each light ray is allowed to be separately detected. More specifically, pixel data corresponding to pixels located at the same position in the unit image formation regions 12D are extracted from the image pickup data D1, and these extracted pixel data (pixel data corresponding to pixels indicated by the same reference numeral in FIG. 3) are synthesized. Thereby, image data D2 as parallax images are obtained. The obtained image data D2 are outputted to the defect correction section 144.

However, at this time, the number (2×2=4 in this case) of pixels allocated to one microlens is equal to the number of viewpoints with different phase differences. Therefore, by the above-described extraction operation and the above-described synthesization operation, parallax images from four viewpoints in total, more specifically, parallax images from viewpoints from the left (corresponding to a reference numeral 2 in FIG. 3), the right (corresponding to a reference numeral 3 in FIG. 3), the top (corresponding to a reference numeral 1 in FIG. 3) and the bottom (corresponding to a reference numeral 4 in FIG. 3) are produced.

The defect correction section 144 corrects a defect in the image data D2 (a defect detected in the defect detection section 141 in the former stage) by, for example, interpolation using peripheral pixels.

The color interpolation processing section 145 performs, for example, color interpolation processing such as a demosaic process on the image data D2 in which the defect is corrected to produce color images of three primary colors. Now, referring to (A) to (D) in FIG. 6, a color interpolation processing operation in the color interpolation processing section 145 will be described below. (A) in FIG. 6 schematically illustrates parallax image data D21 from the top (indicated by the reference numeral 1 in FIG. 3) in the image data D2 obtained from the parallax image producing section 143.

In addition, for the sake of convenience, only a portion corresponding to the unit arrangement U1 of the color filter 130 is illustrated.

As described above, the image pickup data D0 obtained from the image pickup device 13 (or the image pickup data D1 obtained by clamp processing) is divided by color into unit image formation regions 12D corresponding to the color arrangement of the color filter 130. Therefore, as illustrated in (A) in FIG. 6, parallax image data D21 produced by synthesizing pixel data extracted from pixels (for example, pixels indicated by the reference numeral 1) located at the same position in the unit image formation region U1 has the same color arrangement as that of the color filter 130. The same holds true in the case where pixel data extracted from pixels located at another position (for example, pixels indicated by the reference numeral 2 or 3) are synthesized.

Figure 6:
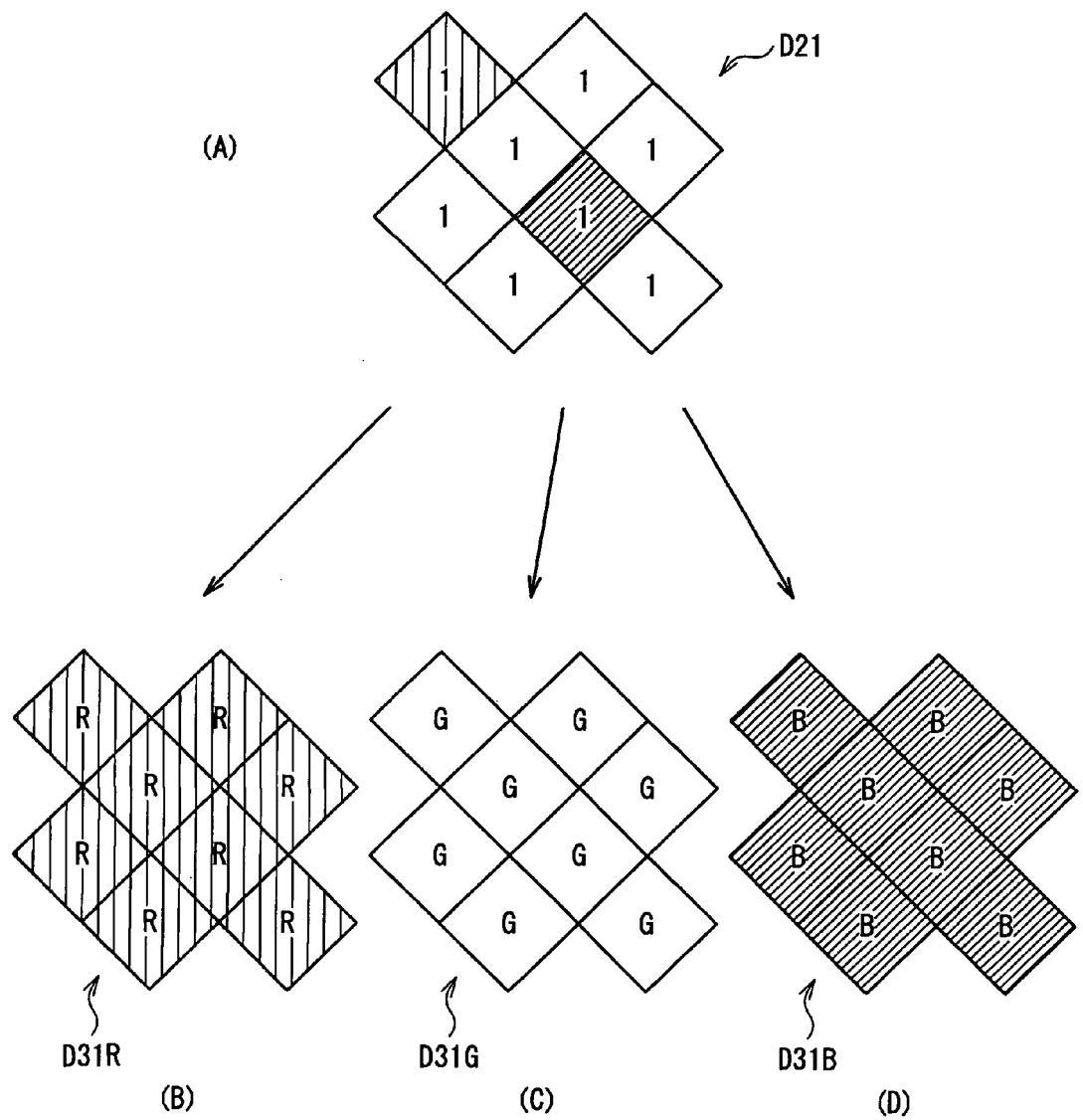
FIG. 6 is a conceptual diagram for describing an example of a color interpolation processing operation.

The interpolation processing for each of R, G and B is performed on the parallax image data D21, thereby as illustrated in (B) to (D) in FIG. 6, red parallax image data D31R, green parallax image data D31G and blue parallax image data D31B are obtained. The obtained parallax image data D31R, D31G and D31B are outputted to the noise reduction section 146 as image data D3.

The noise reduction section 146 performs a process of reducing noise (for example, noise generated when an image is picked up in a dark place or a place with insufficient sensitivity) included in the image data D3. Next, the edge enhancement section 147, the white balance adjustment section 148 and the gamma correction section 149 perform an edge enhancement process in which the edge of an image is enhanced, a white balance adjustment process and a gamma correction process in order on image data obtained by the noise reduction process by the noise reduction section 146, respectively. Thereby, the image data Dout as the parallax images are obtained. In addition, the white balance adjustment process is a process of adjusting color balance affected by an individual difference among devices such as a difference in transmission characteristics of the color filter 130, a difference in spectral sensitivity of the image pickup device 13, illumination conditions, or the like. Moreover, the gamma correction process by the gamma correction section 149 is a process of correcting tone or contrast.

As described above, the image data Dout as the parallax images are outputted from the image processing section 14.

Functions and Effects of Pixel Arrangement in Image Pickup Device 13

Figure 7:
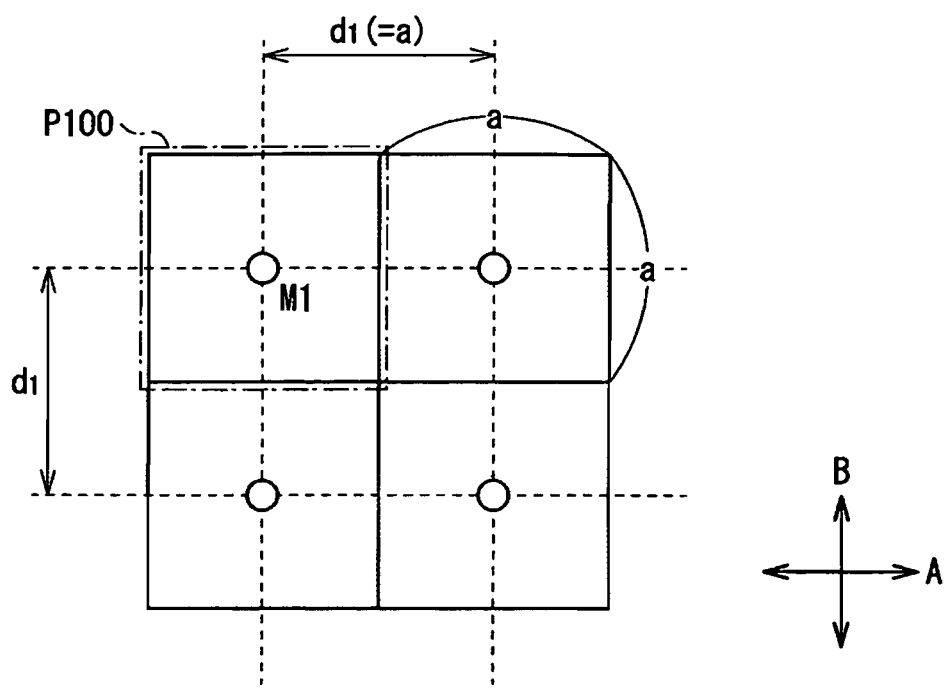
FIG. 7 is a plan view for describing a pixel arrangement in an image pickup device according to a comparative example.

In the above-described image pickup apparatus 1, as illustrated in FIG. 2, the arrangement of the pixels P in the image pickup device 13 is the diagonal arrangement along two directions C and D rotated 45° with respect to the horizontal direction A and the vertical direction B, respectively. Now, as a comparative example, FIG. 7 illustrates a pixel arrangement in which square-shaped pixels P100 with a length a on a side are disposed in a fashion of two-dimensional arrangement along the horizontal direction A and the vertical direction B. In the pixel arrangement in the comparative example, a pitch d1 of the pixels P100 is equal to the length a on a side of the pixel P100 (d1=a). The pitch d1 is a distance in each of the horizontal direction A and the vertical direction B between the centers M1 of adjacent pixels P100.

On the other hand, in the embodiment, the size of the pixel P is the same as that of the pixel P100 in the above-described comparative example, but based on the horizontal direction A and the vertical direction B, the pitch d of the pixels P is reduced to $1/\sqrt{2}$ of the pitch d1 in the above-described comparative example. Thereby, the pitches d of pixels in the horizontal direction A and the vertical direction B are reduced (d<d1). The pitch d is a distance in each of the horizontal direction A and the vertical direction B between centers M of adjacent pixels P.

As described above, in the embodiment, the microlens array 12 in which 2×2 pixels are allocated to each microlens is arranged between the image pickup lens 11 and the image pickup device 13, so light rays from the object 2 are allowed to be received as light ray vectors from different view points. Moreover, the arrangement of the pixels P in the image pickup device 13 is the diagonal arrangement as described above, so compared to the case where pixels with the same size as that of the pixel P are disposed in a fashion of two-dimensional arrangement along the horizontal direction A and the vertical direction B, pixel pitches in the horizontal direction A and the vertical direction B are allowed to be reduced. Typically, the resolution of an image is recognized by human eyes more easily in the horizontal and vertical directions than in a diagonal direction, so when pixels are diagonally arranged as in the case of the embodiment, compared to the case where the pixels are squarely arranged, an apparent number of pixels (two-dimensional resolution) is allowed to be increased. Therefore, information on parallax is obtainable while preventing a decline in apparent resolution.

Moreover, the color filter 130 is arranged on the light-receiving surface of the image pickup device 13, and the color filter 130 includes the largest number of green filter elements 130G. Thus, a large number of filter elements of green which has the highest sensitivity for human eyes are arranged so as to allow an improvement in apparent resolution. In particular, in the embodiment, the pixels P in the image pickup device 13 are diagonally arranged as described above, so the green filter elements 130G are arranged so as to enclose the red filter elements 130R and the blue filter elements 130B. In other words, the unit arrangement U1 is formed so that the ratio (R:G:B) of red, green and blue is 1:6:1, which is larger in number of green than that in a typical Bayer arrangement (R:G:B=1:2:1). Therefore, apparent resolution is easily improved by the diagonal arrangement in the above-described image pickup device 13.

Moreover, in the diagonal arrangement, the pixel size (the pixel area) may be increased. In the case where the size of the image pickup device 13 is not changed, the actual number of pixels is reduced by an increase in the pixel size, but sensitivity is improved by an effect by the above-described diagonal arrangement and an increase in the pixel area, thereby apparent resolution is allowed to be improved. For example, in FIG. 2, in the case where the length a on a side of the pixel P is increased to, for example, $\sqrt{2}a$, the pitch d of the pixels P is equal to the length a, and the pixel area is doubled.

Moreover, the image data D3 as parallax images obtained as described above are suitably used for, for example, stereo system three-dimensional image display. For example, typical stereo system three-dimensional image display is achieved as will be described below. For example, when two images (two parallax images) for right and left eyes taken by two cameras corresponding to human eyes are simultaneously projected on a screen, and a picture on the screen is watched by a viewer wearing a pair of polarized glasses, such three-dimensional image display is achieved. At this time, polarized light rays orthogonal to each other as projection light for the right eye and projection light for the left eye are used in two projectors, and as the pair of polarized glasses, a pair of polarized glasses which allow only polarized light rays orthogonal to each other in the right and left eyes to pass therethrough are used. Thereby, when the images for the right and left eyes are observed by the right and left eyes, respectively, the viewer recognizes the images as a stereoscopic image with a sense of depth.

In the case where the parallax images obtained in the embodiment are used for such stereo system three-dimensional display, two parallax images for the right and left eyes are produced, and the produced parallax images are projected on a screen with the above-described projectors, and then the images are observed by a viewer wearing a pair of polarized glasses, thereby three-dimensional image display is achieved. Thus, parallax images for the right and left eyes are obtainable without using two cameras. Moreover, at this time, as described above, a decline in resolution is low in each of the parallax images. Therefore, a three-dimensional display system having sufficient display quality in spite of a simple configuration is achieved.

Figure 8A:
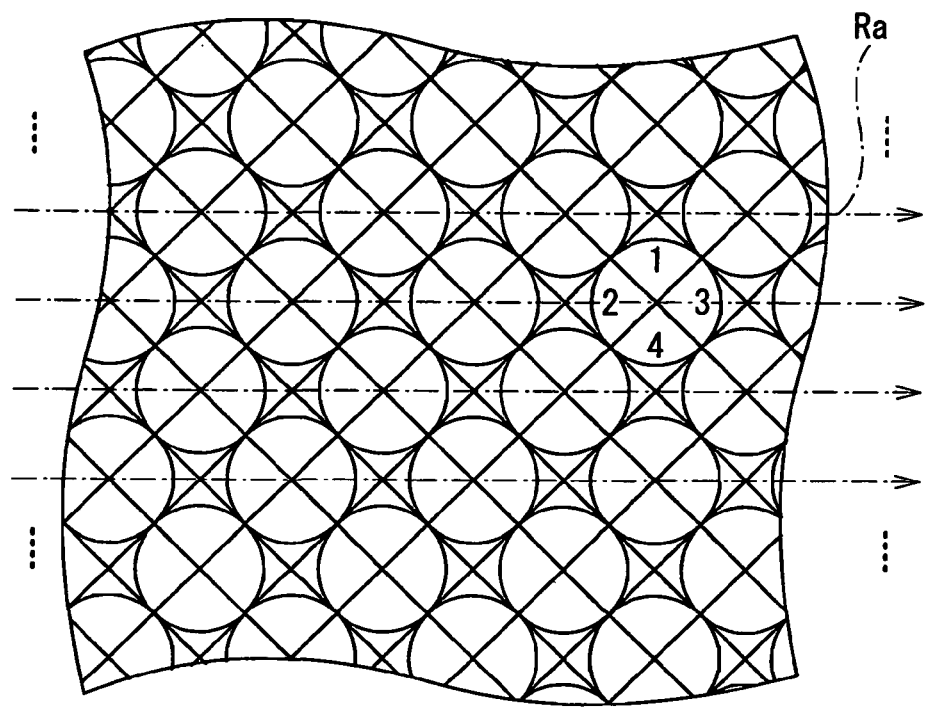
FIGS. 8A and 8B are conceptual diagrams for describing a readout operation in the image pickup device illustrated in FIG. 1.
Figure 8B:
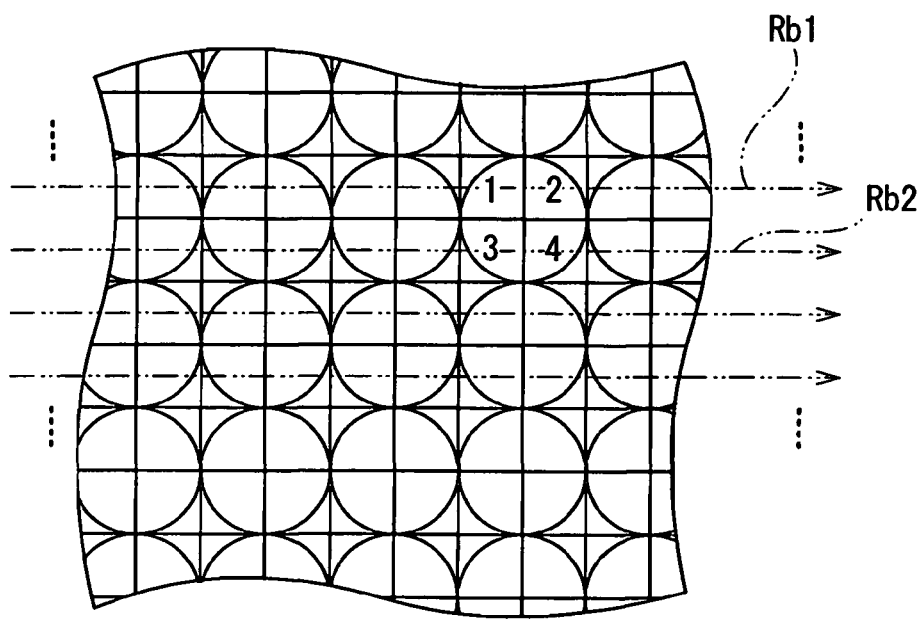

Moreover, in the case where two parallax images from the right and the left (or the top and the bottom) are applied to such stereo system three-dimensional display, as in the case of the embodiment, when the number of pixels allocated to one lens is 2×2, pixel data is allowed to be read at higher speed, compared to the square arrangement. The reason why pixel data is read at higher speed will be described below referring to FIGS. 8A to 8C. FIG. 8A is an illustration for describing readout in the case of the diagonal arrangement, and FIG. 8B is an illustration for describing readout in the case of the square arrangement as a comparative example. For the same of convenience, 2×2 pixels allocated to one lens are indicated by reference numerals 1 to 4, respectively.

In the case of the square arrangement illustrated in FIG. 8B, to obtain right-left parallax images which are symmetrical with respect to an optical axis, pixels on the top and the bottom, that is, pixels indicated by the reference numerals 1 and 3 or pixels indicated by the reference numerals 2 and 4 in FIG. 8B are integrated to produce parallax images. Therefore, it is necessary to read all data corresponding to the pixels 1 to 4 allocated to one lens, and two readout lines (Rb1 and Rb2) per lens are necessary. On the other hand, in the case of the diagonal arrangement illustrated in FIG. 8A, data corresponding to the pixels 2 and 3 in FIG. 8A in each lens are read out, thereby right-left parallax images which are symmetrical with respect to the optical axis are allowed to be produced. In other words, in the diagonal arrangement in which 2×2 pixels are allocated to one lens, it is only necessary to read out data from one readout line (Ra) in each lens, thereby compared to the square arrangement, pixel data is allowed to be read out at higher speed. Moreover, in the case of the diagonal arrangement, an integration process is not necessary, so parallax images with a deep depth of field are obtainable. In this case, although the right-left parallax images are described as examples, the same holds true in the case where two parallax images from the top and the bottom are produced. In this case, data corresponding to the pixels 1 and 4 may be read out from one line in each lens.

Next, modifications of the color filter arranged on the image pickup device 13 of the image pickup apparatus 1 according to the above-described first embodiment will be described below. Like components are denoted by like numerals as of the above-described embodiment, and will not be further described. In addition, in any of modifications, the color filter is divided by color into regions corresponding to the regions each including 2×2 pixels (corresponding to lenses), and the color arrangement is a two-dimensional arrangement rotated 45° corresponding to the diagonal arrangement of the pixels P.

Modification 1

Figure 9:
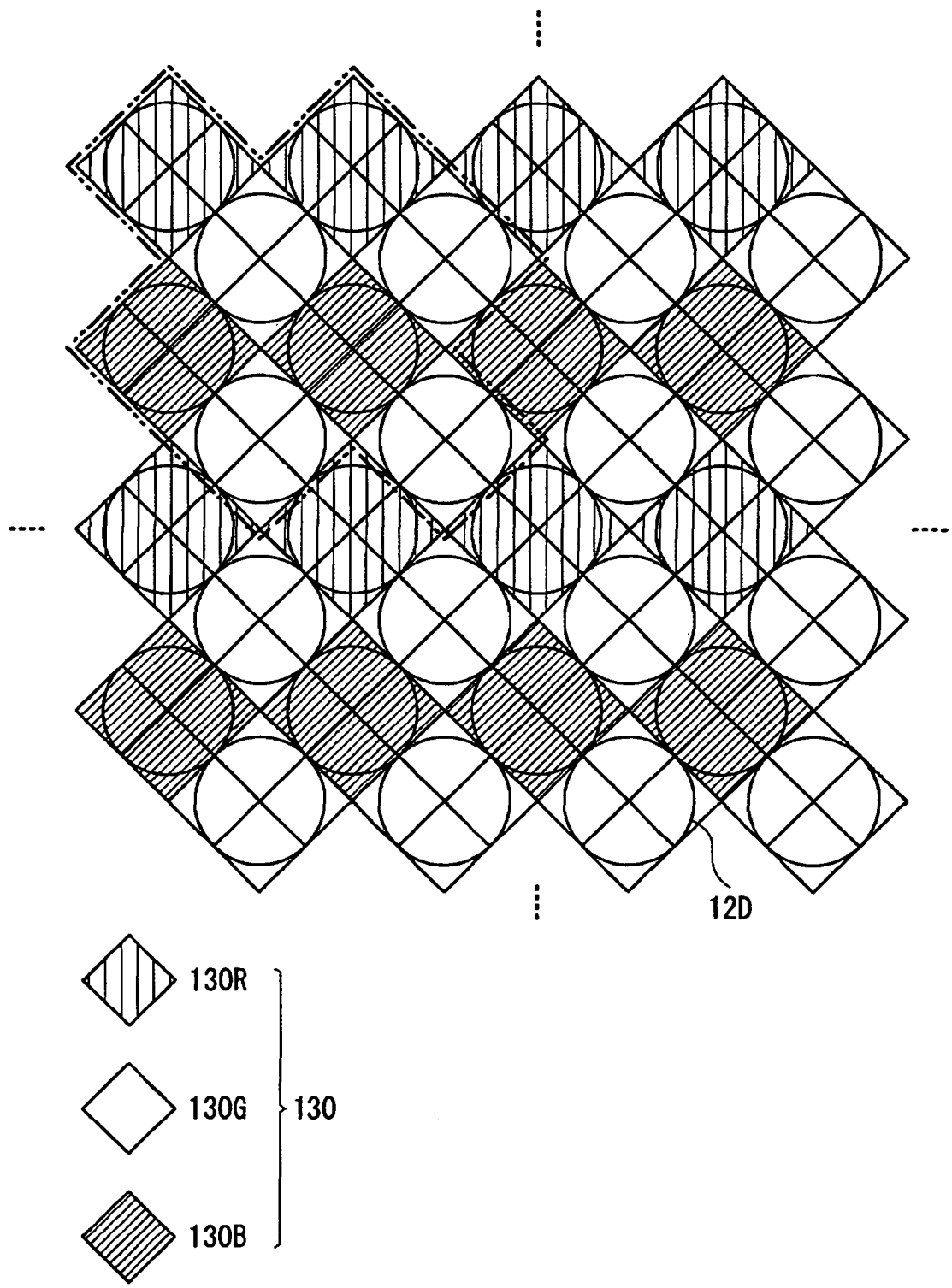
FIG. 9 is a schematic plan view of a color filter according to Modification 1.

FIG. 9 schematically illustrates a planar configuration of a color filter according to Modification 1 on the image pickup device 13. The color filter according to Modification 1 includes filter elements of three primary colors, that is, the red filter elements 130R, the green filter elements 130G and the blue filter elements 130B as in the case of the color filter 130 in the above-described embodiment. However, in the modification, the ratio (R:G:B) of the red filter elements 130R, the green filter elements 130G and the blue filter elements 130B is, for example, 1:2:1.

Modification 2

Figure 10:
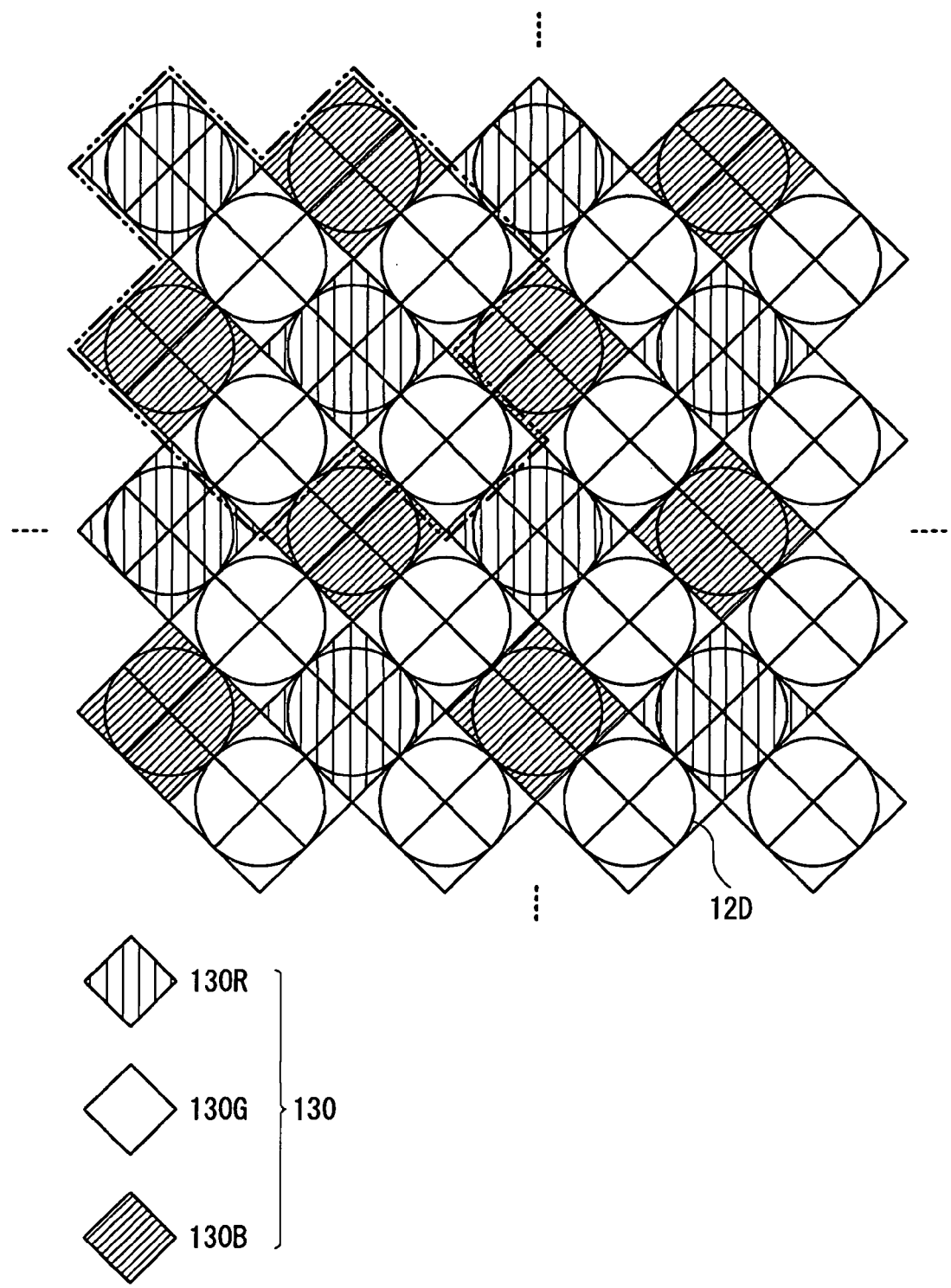
FIG. 10 is a schematic plan view of a color filter according to Modification 2.

FIG. 10 schematically illustrates a planar configuration of a color filter according to Modification 2 on the image pickup device 13. The color fitter according to Modification 2 includes filter elements of three primary colors, that is, the red filter elements 130R, the green filter elements 130G and the blue filter elements 130B as in the case of the color filter 130 in the above-described embodiment. However, in the modification, the ratio (R:G:B) of the red filter elements 130R, the green filter elements 130G and the blue filter elements 130B is, for example, 1:2:1. The color arrangement is equivalent to a Bayer arrangement typically used in related art which is rotated 45° corresponding to the diagonal arrangement of the pixels P.

Like the above-described Modifications 1 and 2, the ratio (R:G:B) of colors in the color filter is not limited to 1:6:1, and may be any other ratio, for example, 1:2:1. Even in such a configuration, when the color filter includes more green filter elements 130G than the red filter elements 130R and the blue filter elements 130B, it is advantageous in improving apparent resolution.

Modification 3

Figure 11:
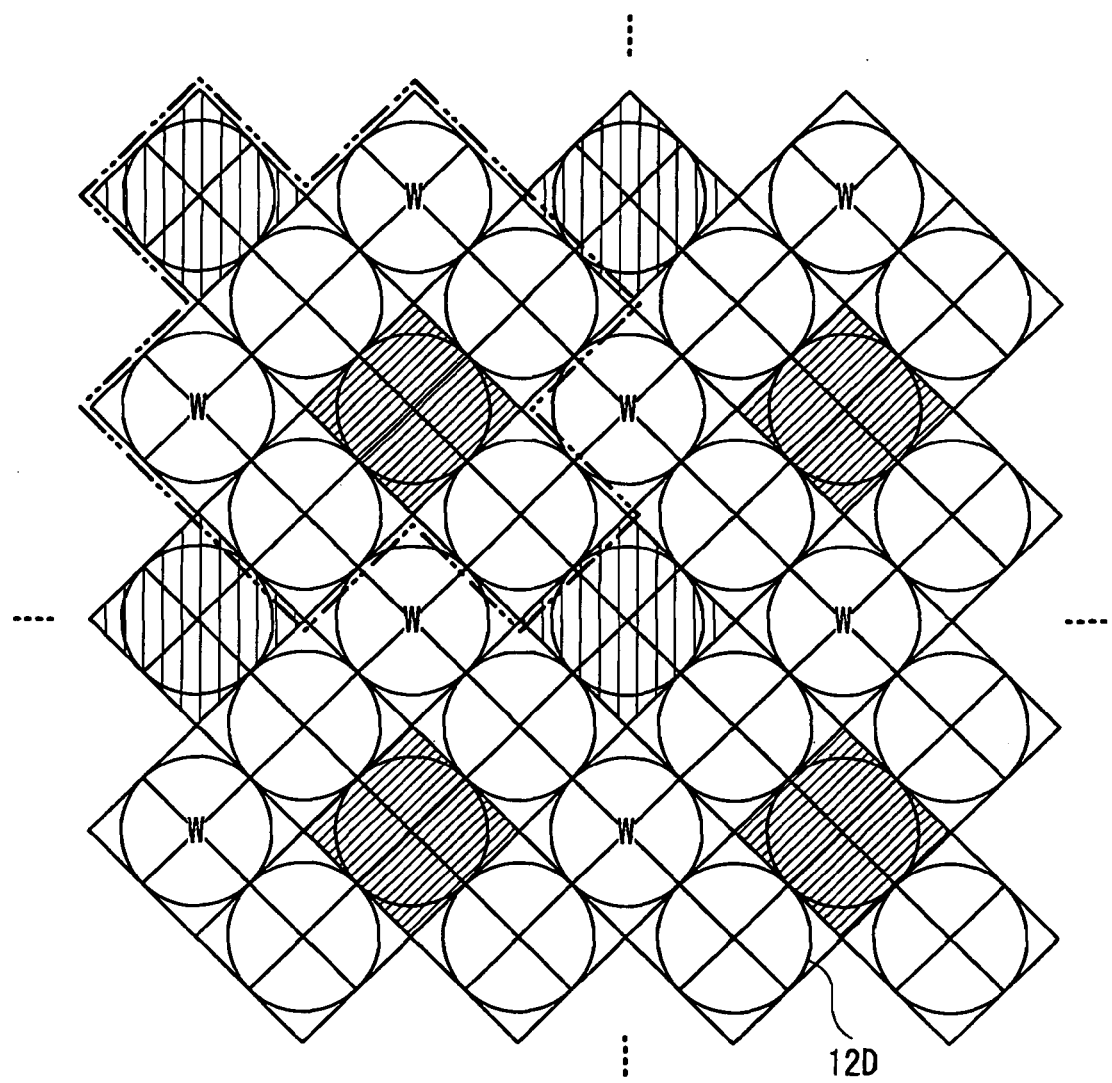
FIG. 11 is a schematic plan view of a color filter according to Modification 3.
Figure 11:
Figure 11:
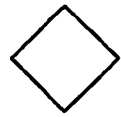
Figure 11:
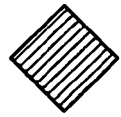
Figure 11:

FIG. 11 schematically illustrates a planar configuration of a color filter according to Modification 3 on the image pickup device 13. The color filter according to Modification 3 includes white filter elements 130W in addition to the red filter elements 130R, the green filter elements 130G and the blue filter elements 130B. In the modification, the ratio (R:G:B:W) of the red filter elements 130R, the green filter elements 130G, the blue filter elements 130B and the white filter elements 130W is 1:4:1:2.

Like the modification, the white filter elements 130W may be arranged in addition to the red filter elements 130R, the green filter elements 130G and the blue filter elements 130B. In such a configuration, RGB components are allowed to be reconstructed from, for example, a white component in image pickup data obtained from the image pickup device 13 by the following formula (1). More specifically, in the case where emphasis is placed on a G component, the G component is determined by the following formula into which an R component and a B component obtained by interpolation from peripheral pixel data are substituted ($G=(W-a \cdot R-c \cdot B)/b$).

$$W=a \cdot R+b \cdot G+c \cdot B \text{ (a, b and c are coefficients)} \tag{1}$$

In addition, in Modification 3, a part of the green filter elements 130G may be replaced with the white filter elements 130W, thereby the red filter elements 130R, the green filter elements 130G, the blue filter elements 130B and the white filter elements 130W may be arranged at a ratio (R:G:B:W) of 1:2:1:4.

Second Embodiment

Figure 12:
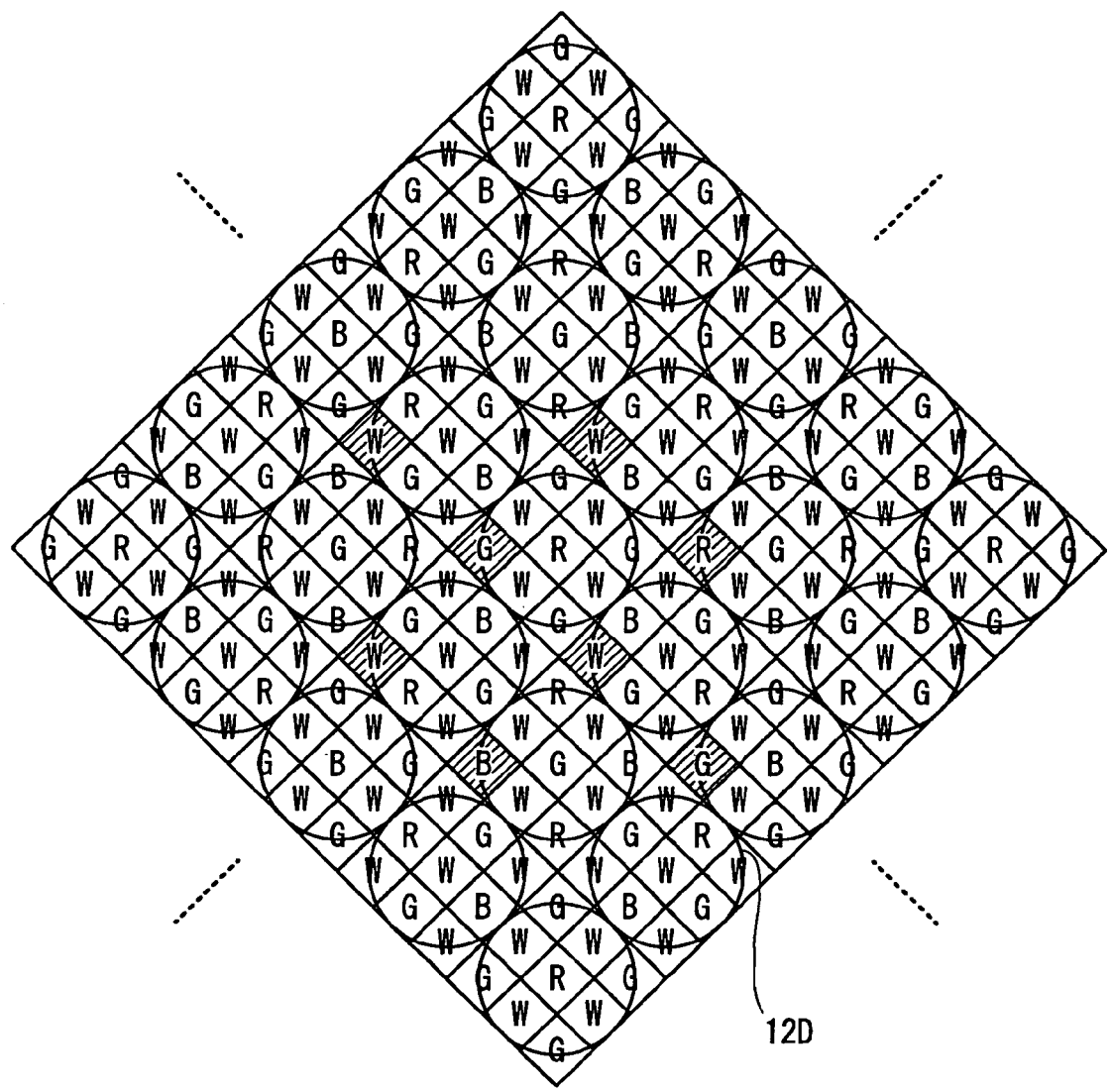
FIG. 12 is a schematic plan view of a color filter according to a second embodiment of the invention.
Figure 12:
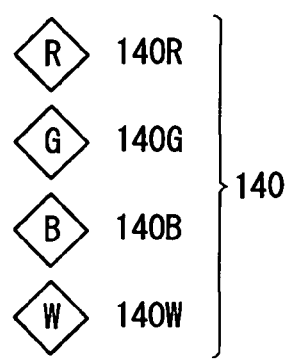

FIG. 12 schematically illustrates a planar configuration of a color filter (a color filter 140) according to a second embodiment of the invention. The color filter 140 is arranged on the image pickup device 13 as in the case of the above-described first embodiment. However, in the embodiment, the number of pixels allocated to one lens in the image pickup device 13 is 3×3 (=9), and the color filter 140 is divided by color into regions each corresponding to a single pixel. The color filter 140 includes, for example, red filter elements 140R, green filter elements 140G, blue filter elements 140B and white filter elements 140W which are regularly arranged, and as the color arrangement of these filter elements 140R, 140G, 140B and 140W, for example, a Bayer arrangement as illustrated in FIG. 12 may be used. The white filter elements 140W are allocated to high-resolution pixels. Like components are denoted by like numerals as of the above-described first embodiment, and will not be further described.

In the embodiment, as in the case of the above-described first embodiment, the image processing section 14 performs predetermined image processing on the image pickup data D0 obtained from the image pickup device 13 so as to produce parallax image data. Unlike the above-described first embodiment, the color filter 140 is divided by color into the regions corresponding to pixels, but in the case where the number of pixels allocated to one lens is 3×3, a produced parallax image have the same color arrangement as that of the color filter 140. Thus, also in the embodiment, when pixels are diagonally arranged, a parallax image is obtainable while preventing a decline in apparent resolution.

In the case where a parallax image is produced based on the pixels diagonally arranged, pixel data in the parallax image has a diagonal arrangement. Therefore, it is desirable to eventually convert the pixel data from the diagonal arrangement to the square arrangement. A conversion process from the diagonal arrangement to the square arrangement will be described below referring to a part of a pixel region on the image pickup device 13 as an example. The conversion process is performed prior to the color interpolation processing.

Figure 13:
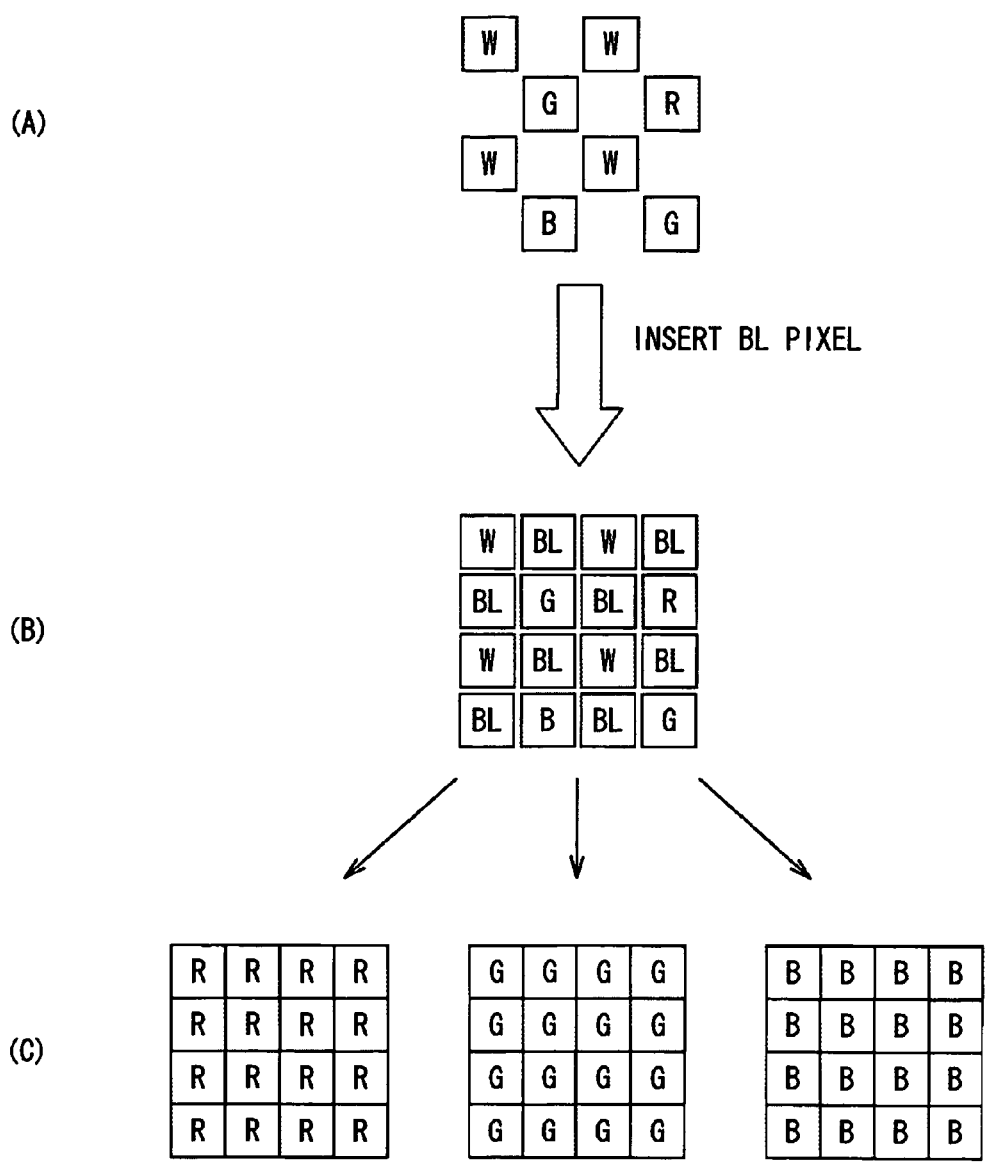
FIG. 13 is a conceptual diagram illustrating an example of a color interpolation processing operation.

In the configuration in FIG. 12, when data extracted from pixels (for example, diagonally shaded parts in FIG. 12) located at the same position in regions each including 3×3 pixels are synthesized to produce a parallax image, the produced parallax image corresponds to the diagonal arrangement of the pixels as illustrated in (A) in FIG. 13. Therefore, interpolation between pixel data is performed to produce a parallax image corresponding to the square arrangement. More specifically, as illustrated in (B) in FIG. 13, blank data is inserted between the pixel data. When the conversion process from the diagonal arrangement to the square arrangement is performed in such a manner, an improvement in the resolution of the parallax image is allowed. The conversion process is applicable to the case where the number of pixels allocated to one lens is 2×2 as described in the first embodiment. When color interpolation processing such as a demosaic process is performed on parallax image data with the square arrangement produced in such a manner, parallax image data of three primary colors as illustrated in (C) in FIG. 13 are produced. At this time, pixel data corresponding to the white filter elements 140W are replaced with any color of R, G and B.

Figure 14A:
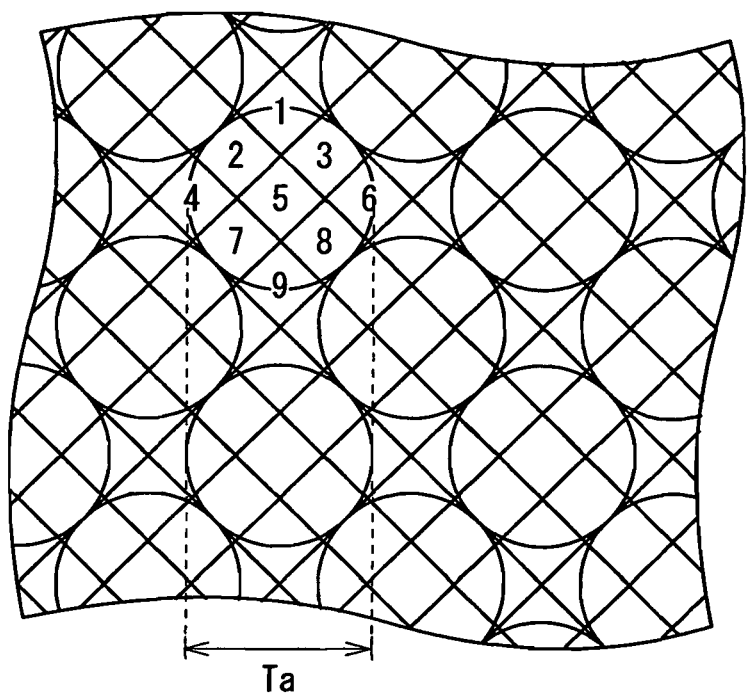
FIGS. 14A and 14B are conceptual diagrams for describing a readout operation in an image pickup device illustrated in FIG. 12.
Figure 14B:
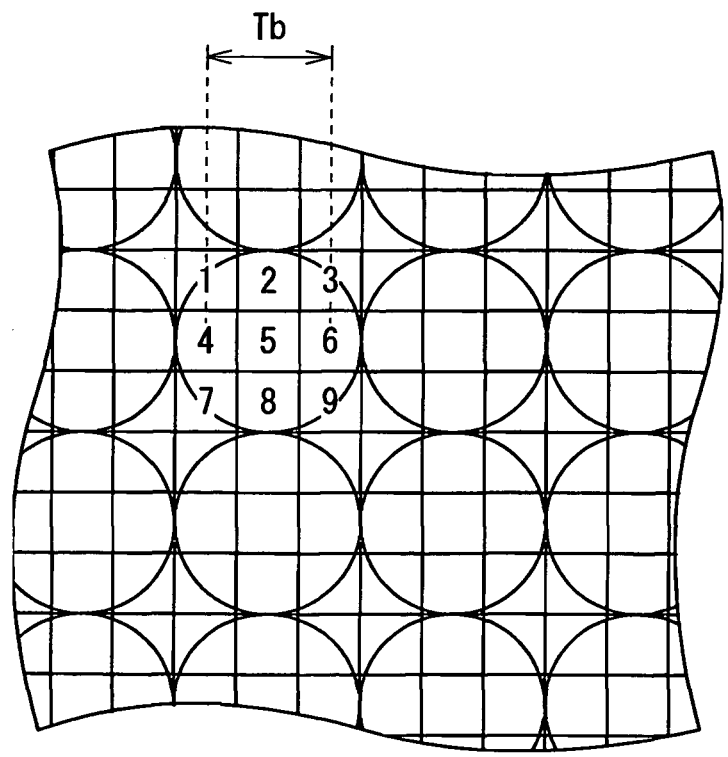

Moreover, in the embodiment, in the case where two parallax images from the right and the left are produced so as to be applied to stereo system three-dimensional display, a base-line length in a horizontal direction may be increased to larger than those in the case of the square arrangement. For example, as illustrated in FIGS. 14A and 14B, in the case where right-left parallax images are produced through the use of data corresponding to pixels 4 and 6 in the regions each including 3×3 pixels, when the pixel area in the diagonal arrangement is the same as that in the square arrangement, a base-line length Ta in the diagonal arrangement is longer than a base-line length Tb in the square arrangement. Likewise, a base-line length in a vertical direction in the diagonal arrangement is longer than those in the square arrangement.

Modification 4

Figure 15:
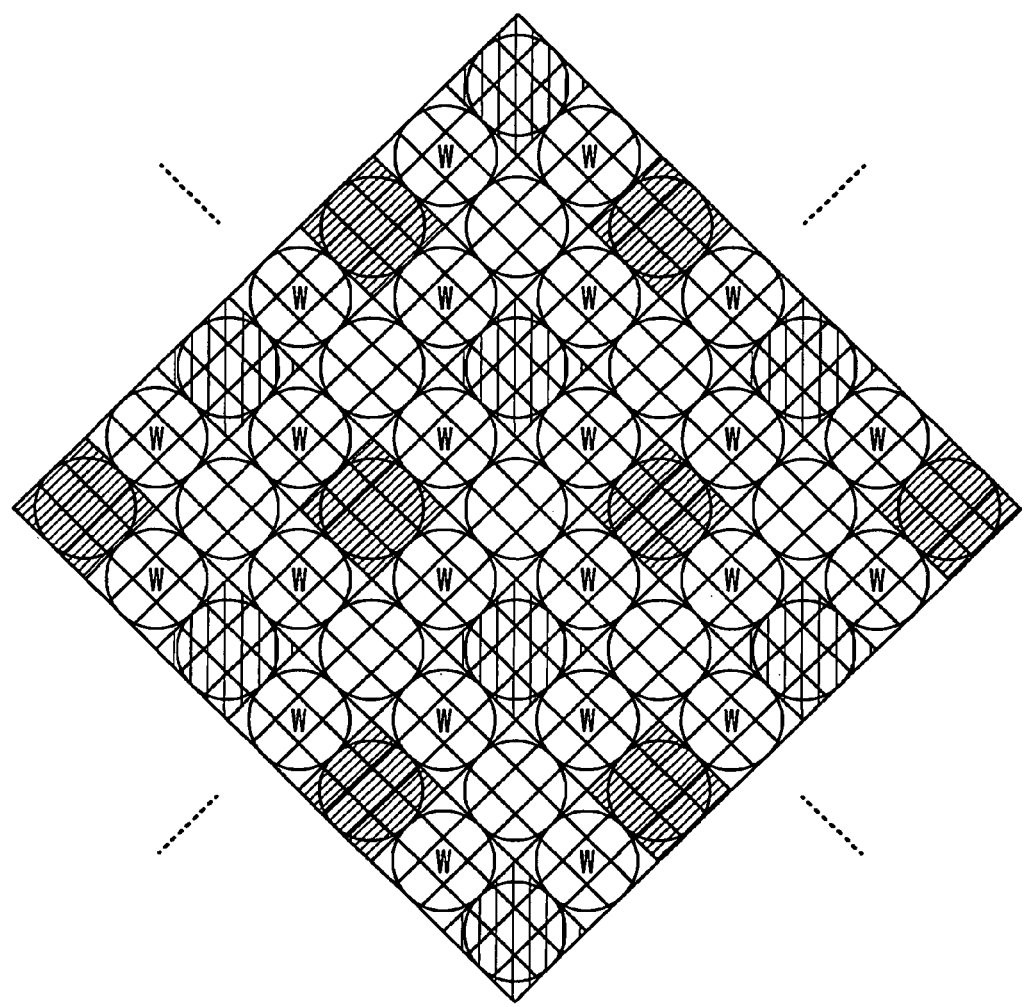
FIG. 15 is a schematic plan view of a color filter according to Modification 4.

FIG. 15 schematically illustrates a planar configuration of a color filter 150 according to Modification 4. The color filter 150 has the same Bayer arrangement as that of the second embodiment, but the color filter 150 is divided by color into regions corresponding to regions each including 3×3 pixels allocated to one microlens (corresponding to lenses). The color filter may be divided into regions corresponding to lenses in such a manner. A parallax image produced by synthesizing data corresponding to pixels located at the same position in the regions corresponding to the lenses by such a color filter 150 has the same color arrangement as that of the color filter 150. In other words, in the case where the number of pixels allocated to each lens is an odd number×an odd number such as 3×3, the color filter may be divided by color into the regions corresponding to the pixels or the lenses.

Although the present invention is described referring to the embodiments and the modifications, the invention is not limited thereto, and may be variously modified. For example, in the above-described embodiments, a configuration in which 2×2=4 pixels or 3×3=9 pixels are allocated to one microlens is described as an example, but the number of pixels allocated to one microlens may be 2 or more, and is not limited to 4 or 9. As long as the number of pixels allocated to one microlens is 2 or more, two parallax images from the right and the left may be produced. Thereby, the parallax images are applicable to the above-described stereo system three-dimensional display. However, in the case where the number of pixels allocated to one microlens is 4 as in the case of the above-described embodiments or the like, the number of viewpoints is larger than the above-described 2 viewpoints, so an improvement in the angular resolution of each parallax image is allowed. On the other hand, when the number of pixels allocated to one microlens is increased to, for example, 3×3, 4×4 . . . , the angular resolution of the parallax image is improved, but two-dimensional resolution of the parallax image is reduced. Therefore, the configuration in the above-described embodiments or the like in which the number of pixels allocated to one microlens is 2×2 is preferably applied to the stereo system three-dimensional display.

Moreover, in the above-described embodiments or the like, a configuration in which a plurality of pixels in the image pickup device 13 are disposed in a fashion of two-dimensional arrangement along two directions rotated 45° with respect to the horizontal direction and the vertical direction, respectively is described as an example. However, the rotation angles of directions where the plurality of pixels are arranged are not limited to 45°, because as long as the directions where the plurality of pixels are arranged form a certain angle with the horizontal direction and the vertical direction, respectively, pixel pitches in the horizontal direction and the vertical direction are reduced. Therefore, the same effects as those in the embodiments or the like of the invention are obtainable.

Further, in the above-described embodiments or the like, a configuration in which as the color filter on the image pickup device 13, a color filter including color filter elements of red, green and blue or color filter elements of red, green, blue and white is described as an example. However, the color filter is not limited thereto, and filter elements of complementary colors such as yellow (Y), magenta (M) and cyan (C) may be used.

In addition, in the above-described embodiments or the like, the case where parallax images produced from image pickup data which is obtained from the image pickup device 13 are applied to stereo system three-dimensional display is described as an example. However, parallax information obtained in the above-described embodiments or the like of the invention is applicable to not only the above-described three-dimensional display but also other applications. For example, four parallax images corresponding to the left, the right, the top and the bottom are produced based on the image pickup data by the above-described technique, and a correlation process is performed based on two or more of these parallax images, thereby information on a distance to an object to be measured is obtainable.

Moreover, in the above-described embodiments or the like, a configuration in which white filter elements allocated to high-resolution pixels are provided in addition to filter elements of three primary colors R, G and B is described. However, a filter may not be arranged in a region corresponding to the high-resolution pixel. Further, the color arrangement of the color filter elements is not limited to the arrangements described in the above-described embodiments or the like, and the color filter elements may be arranged in various modes depending on which color of R, G and B is substituted for pixel data corresponding to the white filter elements, or the number of pixel data corresponding to the white filter elements for which R, G or B is substituted, or the like.

The present application contains subject matter related to that disclosed in Japanese Priority Patent Application JP 2008-298339 filed in the Japan Patent Office on Nov. 21, 2008 and Japanese Priority Patent Application JP 2009-113942 filed in the Japan Patent Office on May 8, 2009, the entire content of which is hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. An image pickup apparatus comprising:
   an image pickup lens having an aperture stop;
   an image pickup device including a plurality of pixels and obtaining image pickup data based on light received on the plurality of pixels, the plurality of pixels being disposed in a fashion of two-dimensional arrangement along two directions rotated a certain angle with respect to a horizontal direction and a vertical direction, respectively;
   an image processing section performing image processing based on the image pickup data obtained from the image pickup device;
   a microlens array including N>1 microlenses arranged between the image pickup lens and the image pickup device so that one microlens is allocated to 2×2 pixels in the image pickup device; and
   a color filter arranged on a light-receiving surface of the image pickup device, the color filter being divided by color into regions each corresponding to an arrangement of four pixels allocated to one microlens,
   wherein the pixels allocated to each microlens $L_i$ are arranged in positions $P_{(i,j)}$, where i={1, 2, ..., N} and j={1, 2, 3, 4},
   the image processing section synthesizes same-position pixel data $D_j$ to produce parallax images $I_j$ that each correspond to a respective pixel position, wherein a set of same-position data $D_{j=n}$ corresponds to image pickup data extracted from each of the pixels located at same positions $P_{(i,j=n)}$, where n is an integer and $1 \leq n \leq 4$, and the parallax images $I_j$ include right-left parallax images or top-bottom parallax images.

2. The image pickup apparatus according to claim 1, wherein the plurality of pixels are two-dimensionally arranged along two directions rotated 45° with respect to the horizontal direction and the vertical direction.

3. The image pickup apparatus according to claim 1, wherein the color filter includes regularly-arranged filter elements of a plurality of colors including green (G).

4. The image pickup apparatus according to claim 3, wherein the color filter includes red (R) filter elements, green filter elements and blue (B) filter elements, and the ratio (R:G:B) of the red filter elements, the green filter elements and the blue filter elements is 1:6:1.

5. The image pickup apparatus according to claim 3, wherein the color filter includes red (R) filter elements, green filter elements and blue (B) filter elements, and the ratio (R:G:B) of the red filter elements, the green filter elements and the blue filter elements is 1:2:1.

6. The image pickup apparatus according to claim 3, wherein the color filter includes red (R) filter elements, green filter elements, blue (B) filter elements and white (W) filter elements.

7. An image pickup apparatus comprising:
   an image pickup lens having an aperture stop;
   an image pickup device including a plurality of pixels and obtaining image pickup data based on light received on the plurality of pixels, the plurality of pixels being disposed in a fashion of two-dimensional arrangement along two directions rotated a certain angle with respect to a horizontal direction and a vertical direction, respectively;
   an image processing section performing image processing based on the image pickup data obtained from the image pickup device;
   a microlens array including N>1 microlenses arranged between the image pickup lens and the image pickup device so that one microlens is allocated to $M \geq 2$ pixels in the image pickup device; and
   a color filter arranged on a light-receiving surface of the image pickup device, the color filter being divided by color into regions each corresponding to an arrangement of M pixels allocated to one microlens,
   wherein the pixels allocated to each microlens $L_i$ are arranged in positions $P_{(i,j)}$, where i={1, 2, ..., N} and j={1, 2, ..., M},
   the image processing section synthesizes same-position pixel data $D_j$ to produce parallax images $I_j$ that each correspond to a respective pixel position, wherein a set of same-position data $D_{j=n}$ corresponds to pixel data extracted from each of the pixels located at same positions $P_{(i,j=n)}$, where n is an integer and $1 \leq n \leq M$, and the parallax images $I_j$ include right-left parallax images or top-bottom parallax images.

8. The image pickup apparatus according to claim 7, wherein M=9 and one microlens is allocated to 3×3 pixels in the image pickup device.

* * * * *